(12) United States Patent
Xu

(10) Patent No.: US 7,633,756 B2
(45) Date of Patent: Dec. 15, 2009

(54) HEAT DISSIPATION DEVICE WITH FAN HOLDER

(75) Inventor: Hong-Bo Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/050,904

(22) Filed: Mar. 18, 2008

(65) Prior Publication Data

US 2009/0161316 A1 Jun. 25, 2009

(30) Foreign Application Priority Data

Dec. 19, 2007 (CN) .......................... 2007 1 0203242

(51) Int. Cl.
*H05K 7/20* (2006.01)
*F28F 7/00* (2006.01)
(52) U.S. Cl. .................... 361/700; 165/104.33; 361/697
(58) Field of Classification Search ................. 361/697, 361/700; 165/104.33
See application file for complete search history.

(56) References Cited

U.S. PATENT DOCUMENTS 7,147,738 B2 * 12/2006 Bjekovic et al. ............ 156/228
7,174,951 B1 * 2/2007 Lin ........................ 165/104.33
7,414,848 B2 * 8/2008 Zhou et al. .................. 361/704
7,443,679 B2 * 10/2008 Li et al. ...................... 361/704
2006/0144572 A1 * 7/2006 Yu et al. ................. 165/104.33
2008/0105407 A1 * 5/2008 Yeh et al. ............... 165/104.28
2008/0115915 A1 * 5/2008 Chen ..................... 165/104.33
2008/0144286 A1 * 6/2008 Li et al. ...................... 361/701

* cited by examiner

*Primary Examiner*—Gregory D Thompson
(74) *Attorney, Agent, or Firm*—Frank R. Niranjan

(57) ABSTRACT

A heat dissipation device includes a heat sink assembly, a fan holder and a fan mounted in the fan holder. The heat sink assembly includes a heat spreader for contacting with a heat-generating electronic component, and two fin assemblies thermally connecting with the heat spreader and sandwiching the fan therebetween. Each fin assembly defines cutouts at opposite ends thereof. The fan holder includes a top plate and a pair of vertical, downward-extending baffle walls. A pair of clamping arms extends from each baffle wall and inserted into the cutouts of the fin assemblies. Screws extend through the top plate to engage in holes defined in the fin assemblies and communicating with the cutouts. A vaulted operating plate is formed by the top plate for a user to grip to conveniently transport the heat dissipation device.

20 Claims, 4 Drawing Sheets

HEAT DISSIPATION DEVICE WITH FAN HOLDER

BACKGROUND OF THE INVENTION

1. Field of the Invention

The present invention generally relates to heat dissipation devices, and more particularly to a heat dissipation device for cooling an electronic component, such as an integrated circuit package. The heat dissipation device has a fan holder to which a fan is attached. The fan is sandwiched between a pair of fin assemblies of the heat dissipation device. The fan holder can facilitate an assembly of the fan into the heat dissipation device and a transportation of the heat dissipation device.

2. Description of Related Art

Electronic components, such as central processing units (CPUs), comprise numerous circuits operating at high speed and generating substantial heat. Under most circumstances, it is necessary to cool the CPUs in order to maintain safe operating conditions and assure that the CPUs function properly and reliably. In the past, various approaches have been used to cool electronic components. Typically, a heat dissipation device is attached to an outer surface of a CPU to remove the heat therefrom.

A typical heat dissipation device generally comprises a heat sink for absorbing heat from an electronic component mounted on a printed circuit board and a fan mounted on the heat sink. A fan holder is used for connecting the fan and the heat sink to mount the fan onto the heat sink. The fan is spaced from the heat sink by the fan holder whereby an airflow generated by the fan cannot totally flow through the heat sink; thus, the heat dissipation efficiency of the conventional heat dissipation device is not high. Furthermore, it is not convenient to assemble the fan holder to the heat sink of the conventional heat dissipation device. Finally, it is not convenient to transport the heat dissipation device when required to do so.

Accordingly, what is needed is a heat dissipation device which can overcome the above-mentioned problems and shortcomings.

SUMMARY OF THE INVENTION

According to an embodiment of the present invention, a heat dissipation device includes a heat sink assembly, a fan holder and a fan mounted in the fan holder. The heat sink assembly includes a heat spreader for contacting with a heat-generating electronic component, and two fin assemblies thermally connecting with the heat spreader and sandwiching the fan therebetween. Each fin assembly consists of fins each defining cutouts at two lateral portions thereof. The fan holder includes a top plate mounted on tops of the fin assemblies and a pair of vertical baffle walls extending downwardly from two opposite ends of the top plate. A pair of clamping arms extends from two opposite edges of each of the baffle walls of the fan holder. The fan is mounted between the fin assemblies by first fittingly inserting the clamping arms into the cutouts of the fins and then pushing the fan/fan holder combination downwardly until the top plate of the fan holder contacts the tops of the fin assemblies. Four screws are used to extend through the top plate to threadedly engage with threads formed in four through holes defined in the fins. The top plate has a vaulted operating plate for facilitating a user to grip the heat dissipation device to transport it when required to do so.

Other advantages and novel features will become more apparent from the following detailed description of preferred embodiment when taken in conjunction with the accompanying drawings.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
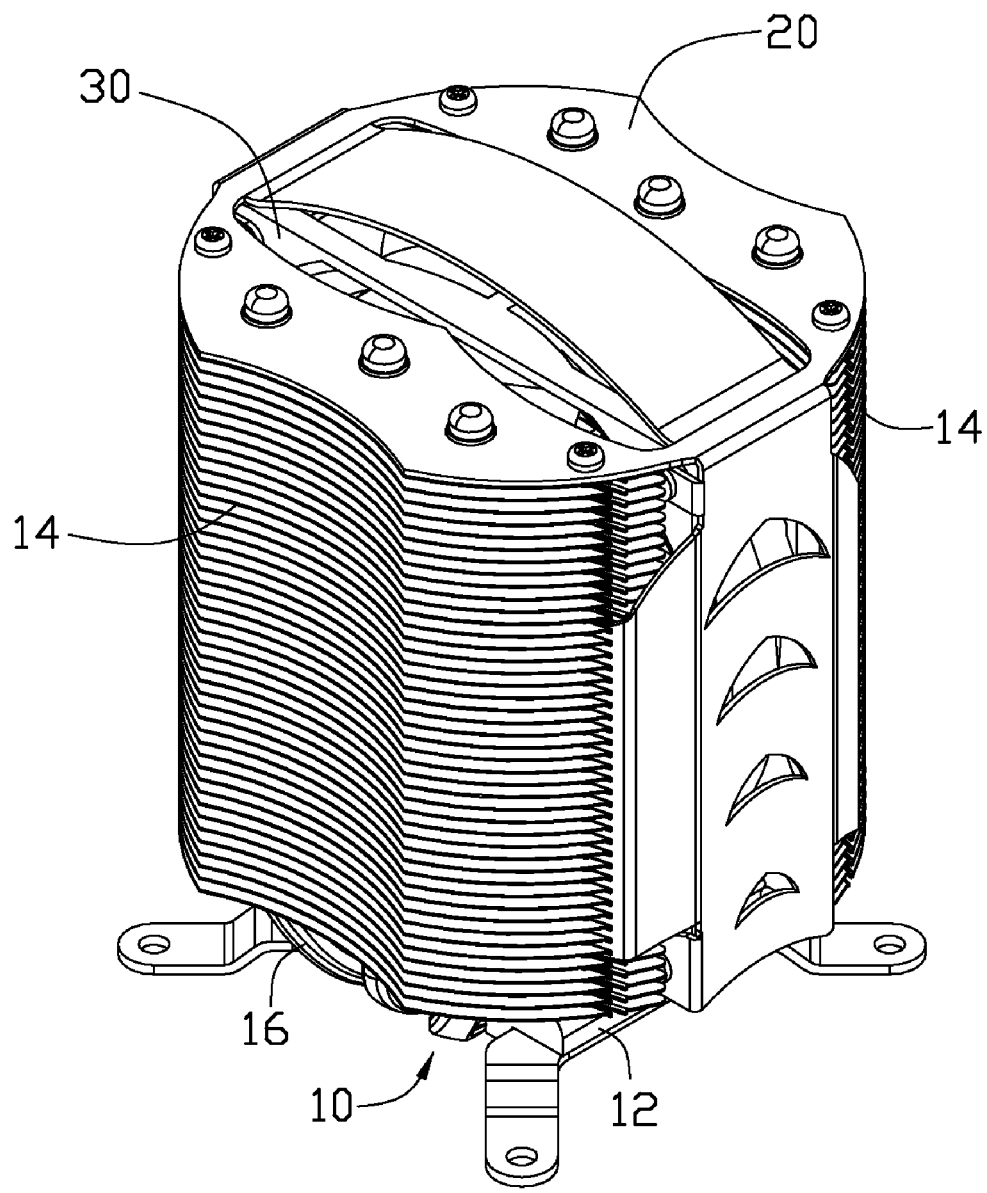
FIG. 1 is an assembled, isometric view of a heat dissipation device in accordance with a preferred embodiment of the present invention.
Figure 2:
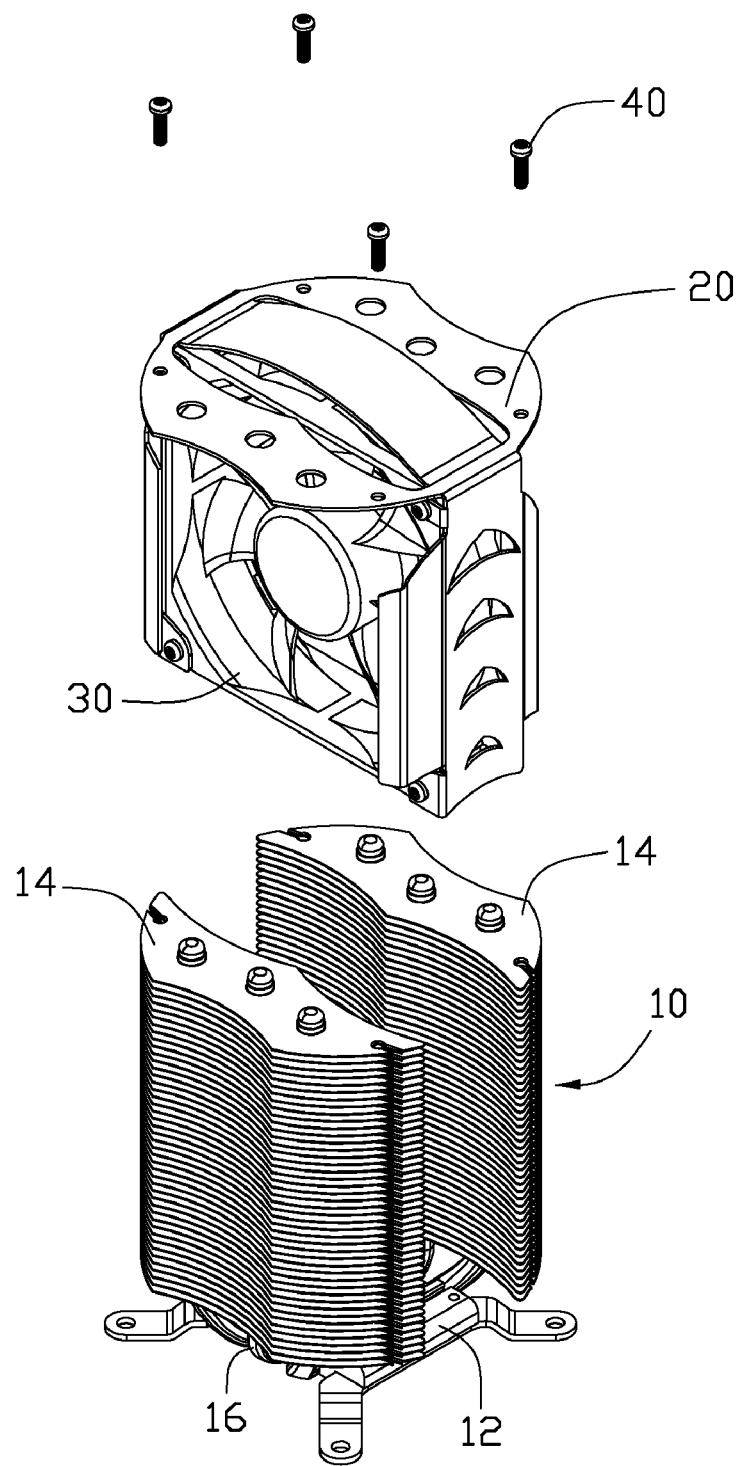
FIG. 2 is an exploded, isometric view of the heat dissipation device of FIG. 1.

Referring to FIGS. 1-2, a heat dissipation device in accordance with a preferred embodiment of the present invention is shown. The heat dissipation device is for being mounted to a printed circuit board (not shown) to remove heat from a heat-generating electronic component (not shown) mounted on the printed circuit board, such as a CPU (not shown). The heat dissipation device comprises a heat sink assembly 10 for contacting the CPU, a fan holder 20 mounted on the heat sink assembly 10 and a fan 30 secured in the heat sink assembly 10.

Figure 3:
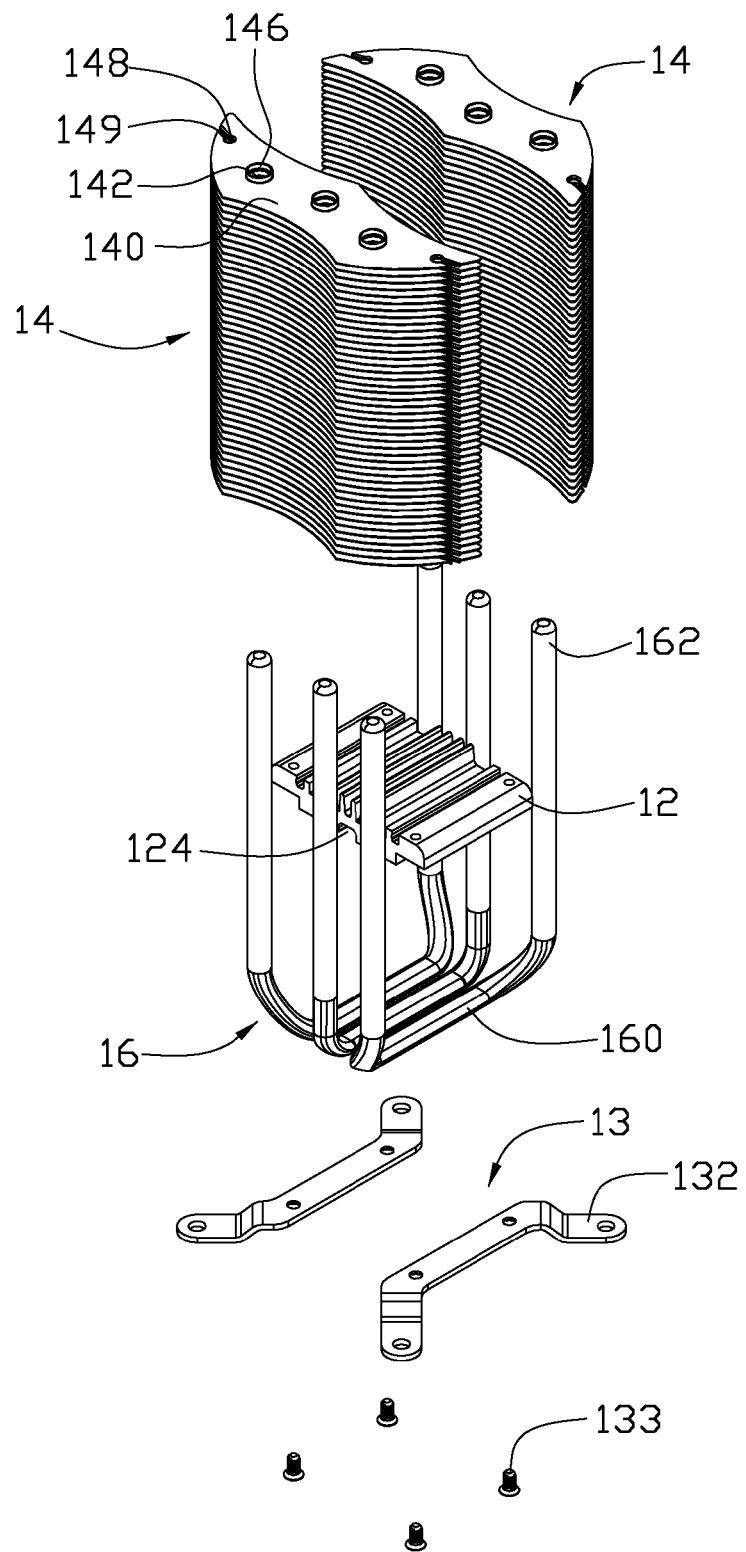
FIG. 3 is an explored, isometric view of a heat sink assembly of the heat dissipation device of FIG. 2.

Referring to FIG. 3, the heat sink assembly 10 comprises a heat spreader 12, a pair of fin assemblies 14, three parallel U-shaped heat pipes 16 thermally connecting the heat spreader 12 and the fin assemblies 14.

The heat spreader 12 has a rectangular configuration. The heat spreader 12 has a bottom face (not labeled) for contacting the CPU to absorb heat therefrom. The heat spreader 12 defines three grooves 124 at the bottom surface thereof. Two mounting brackets 13 each with a pair of ears 132 are attached to opposite bottom sides of the heat spreader 12 via four screws 133 extending through the mounting brackets 13 to engage with the heat spreader 12. The heat spreader 12 thermally engages with the CPU mounted on the printed circuit board by bringing four fasteners (not shown) to extend through the four ears 132 to threadedly engage with a retainer (not shown) attached to a bottom side of the printed circuit board.

Each heat pipe 16 comprises a horizontal evaporation portion 160 and a pair of vertical condensation portions 162 parallel to each other. The condensation portions 162 extend from two opposite ends of the evaporation portion 160. The evaporation portions 160 of the heat pipes 16 are soldered in the grooves 124 of the heat spreader 12. Bottom faces (not labeled) of the evaporation portions 160 are coplanar with the bottom face of the heat spreader 12 for cooperatively contacting the CPU. The condensation portions 162 extend upwardly through the two fin assemblies 14.

Each fin assembly 14 consists of a plurality of parallel fins 140. Each fin 140 has a periphery consisting of a plurality of arc edges. Furthermore, each fin 140 is so oriented that it is parallel to the heat spreader 12. The fins 140 are perforated with three pairs of through holes 142, corresponding to the condensing portions 162 of the three heat pipes 16. Each of the through holes 142 has its respective annular sidewall 146 that is formed during punching the corresponding through hole 142. The condensing portions 162 of the heat pipes 16 are received in the through holes 142 and soldered to the sidewalls 146 so that the fins 140 are combined with the condensation portions 162 of the heat pipes 16 and form a plurality of horizontal channels (not labeled) therebetween. Each fin 140 is elongated and has two opposite ends (not labeled). Each fin 140 defines two through holes 148 near the two opposite ends, respectively, and two cutouts 149 each communicating a corresponding hole 148 with a corresponding end of the fin 140.

Figure 4:
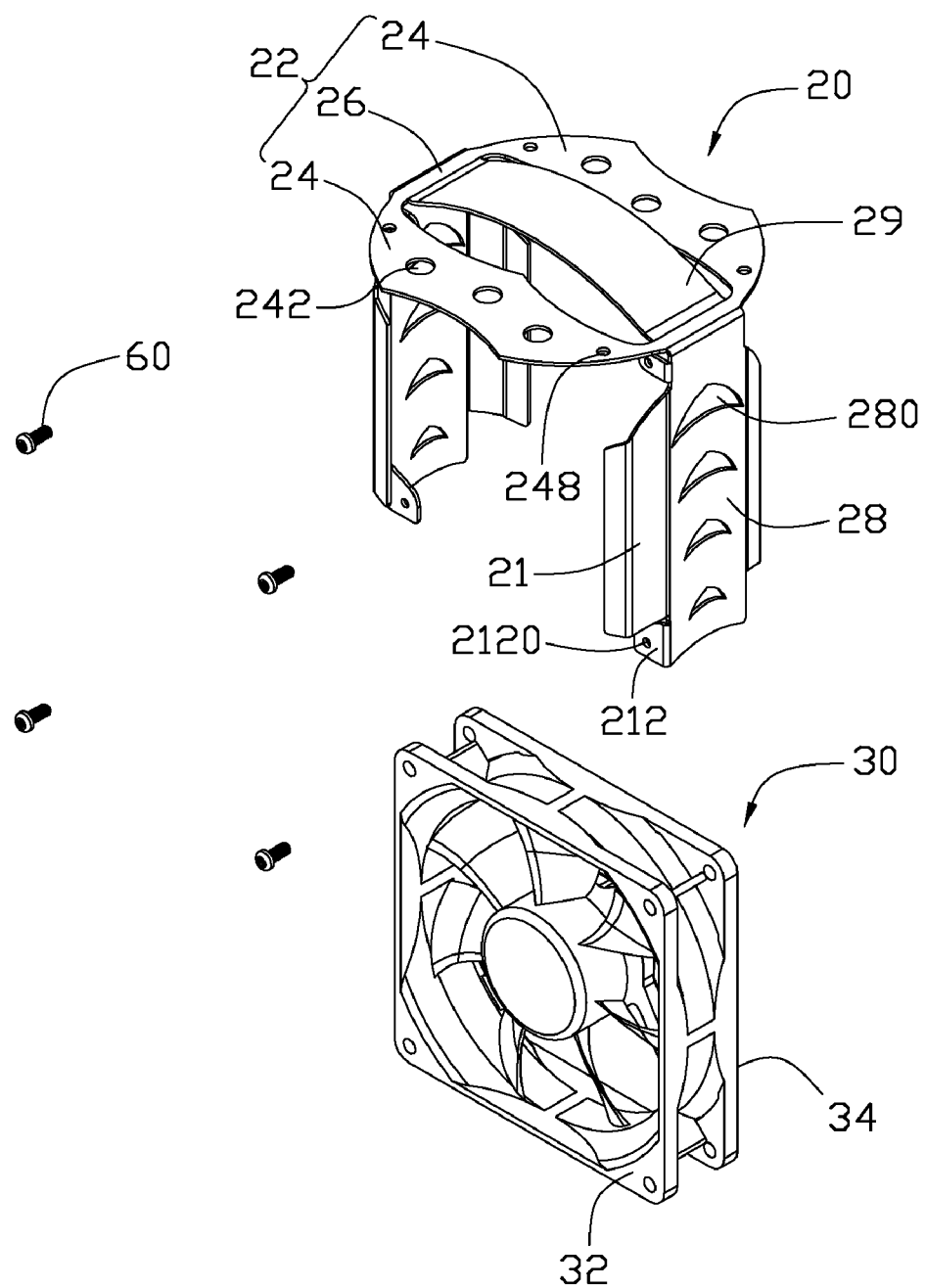
FIG. 4 is an explored, isometric view of a fan and a fan holder of the heat dissipation device of FIG. 2.

Referring to FIG. 4, the fan holder 20 consists of a top plate 22 and a pair of vertical baffle walls 28 extending downwardly from two opposite ends of the top plate 22. The baffle walls 28 are parallel to each other. The top plate 22 has two mounting portions 24 corresponding to the fin assemblies 14 respectively. Two connecting portions 26 each connect with two ends of the mounting portions 24. The mounting portions 24 and the connecting portions 26 surround to form an opening (not labeled) in the center of the top plate 22. A vaulted operating plate 29 connects with the connecting portions 26 and is located above the opening. Each mounting portion 24 has a profile similar to that of the fin 140 and defines three through holes 242 to correspondingly receive the condensation portions 162 of the heat pipes 16. Each mounting portion 24 defines two through holes 248 at two opposite ends thereof, corresponding to the through holes 148 of the fins 140. The baffle walls 28 extend downwardly from the connecting portions 26 of the top plate 22. The baffle walls 28 each have a width similar to a distance between the two fin assemblies 14. The baffle walls 28 each define four through holes 280 for providing through of light emitted from LEDs (not shown) mounted on the fan 30. The LEDs lighten when the fan 30 runs. A pair of elongated clamping arms 21 extend from two opposite edges of each baffle wall 28. The clamping arms 21 have an arced shape and are used to extend into the cutouts 149 of the fins 140 to clasp the fin assemblies 14. A pair of tabs 212 extend perpendicularly from one edge of each baffle wall 28 and are located near top and bottom ends of the clamping arm 21. Each tab 212 defines a hole 2120 corresponding to a corner of the fan 30.

The fan 30 has a square configuration and comprises a pair of parallel plates 32, 34. Four screws 60 extend through the holes 2120 of the tabs 212 of the fan holder 20 to threadedly engage in four corners of the fan 30, whereby the fan 30 is mounted to and enclosed by the fan holder 20.

Referring to FIG. 2 again, in assembly of the heat dissipation device, the heat sink assembly 10 is mounted on the CPU to remove heat from the CPU. The fan holder 20 secured with the fan 30 therein is brought to slide from top to bottom of the heat sink assembly 10 with the clamping arms 21 fitted in the cutouts 149 of the fin assemblies 14 until the fan 30 is received between the fin assemblies 14 and the mounting portions 24 of the top plate 22 abut against top fins 140 of the fin assemblies 14. Four screws 40 are then brought to extend through the through holes 248 of the top plate 22 to engage with threads formed in the through holes 148 of the fins 140.

In used, the fin assemblies 14 absorb the heat from the CPU. When the fan 30 operates, airflow generated by the fan 30 flows through the channels of the fin assemblies 14 to take heat away therefrom. Accordingly, the heat generated by the CPU can be quickly dissipated. Inlet and outlet (not labeled) of the fan 30 face the fin assemblies 14, respectively. Almost all of the airflow generated by the fan 30 flows through the fin assemblies 14; thus, the heat dissipation efficiency of the heat dissipation device in accordance with the present invention is high. In addition, in the present invention, with the provision of the clamping arms 21 fittingly sliding in the cutouts 149 of the fin assemblies 14, the fan holder 20 together with the fan 30 can be reliably and easily mounted to the fin assemblies 14. Simultaneously, because the clamping arms 21 of the fan holder 20 clasp the two fin assemblies 14, the heat sink assembly 10, the fan holder 20 and the fan can be firmly secured together. In addition, by the vaulted operating plate 29, the heat dissipation device can be conveniently gripped by a user to be transported when required.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink assembly comprising a heat spreader adapted for contacting with a heat-generating electronic component, and two fin assemblies thermally connecting with the heat spreader, each fin assembly consisting of fins which define cutouts at two ends thereof;
   a fan holder consisting of a top plate mounted on a top of each of the fin assemblies and a pair of vertical baffle walls each extending downwardly from one of two opposite ends of the top plate, a pair of clamping arms each extending from one of two opposite edges of each baffle wall of the fan holder, each of the clamping arms being inserted into a corresponding one of the cutouts of the fins; and
   a fan being enclosed by the fan holder and sandwiched between the two fin assemblies, for generating an airflow through the fin assemblies.

2. The heat dissipation device as described in claim 1, wherein the fin assemblies define a plurality of through holes therein, a plurality of screws extending through the top plate of the fan holder, each screw engaging in a corresponding one of the through holes of the fin assemblies.

3. The heat dissipation device as described in claim 2, wherein each of the cutouts of each fin communicates with a corresponding one of the through holes of the each fin and an edge of the each fin.

4. The heat dissipation device as described in claim 1, wherein each of the baffle walls forms a pair of tabs from an edge of each of the baffle walls, the fan being mounted on the tabs of each of the baffle walls.

5. The heat dissipation device as described in claim 1, wherein the fan holder has a vaulted operating plate connecting with the two opposite ends of the top plate and is located above the top plate.

6. The heat dissipation device as described in claim 1, wherein the heat sink assembly further comprises a heat pipe having an evaporation portion thermally connecting with the heat spreader and two condensation portions extending from the two opposite ends of the evaporation portion and through the fin assemblies.

7. The heat dissipation device as described in claim 6, wherein the heat spreader defines a groove for receiving the evaporation portion of the heat pipe, a bottom face of the evaporation portion being coplanar with a bottom face of the heat spreader, adapted for cooperatively contacting the heat-generating electronic component.

8. The heat dissipation device as described in claim 7, wherein the heat pipe is U-shaped.

9. The heat dissipation device as described in claim 1, wherein the fan has inlet and outlet facing the fin assemblies respectively.

10. The heat dissipation device as described in claim 9, wherein the clamping arms are elongated and arced.

11. A heat dissipation device comprising:
a fan;
a heat sink assembly comprising a heat spreader adapted for contacting with a heat-generating electronic component, two fin assemblies sandwiching the fan therebetween, and a heat pipe thermally connecting with the heat spreader and the fin assemblies, each fin assembly defining cutouts at opposite ends thereof; and
a fan holder securing the fan therein, consisting of a pair of vertical baffle walls each at one of two lateral portions thereof, a pair of clamping arms each extending from one of two opposite edges of each baffle wall of the fan holder, each of clamping arms being inserted into a corresponding one of the cutouts of the fin assemblies, the clamping arms clamping the fin assemblies.

12. The heat dissipation device as described in claim 11, wherein each fin assembly consists of fins parallel to the heat spreader.

13. The heat dissipation device as described in claim 11, wherein the clamping arms are elongated and arced.

14. The heat dissipation device as described in claim 11, wherein each of the baffle walls forms a pair of tabs from an edge of each of the baffle walls, the fan being mounted on the tabs of the baffle walls.

15. A heat dissipation device comprises:
a heat spreader adapted for absorbing heat from a heat-generating electronic component;
two fin assemblies mounted on the heat spreader with a space between the two fin assemblies;
a fan holder having a top plate and two baffle walls extending downwardly from the top plate, each baffle wall defining at least a clamping arm fittingly received in a cutout defined in each fin assembly;
a fan mounted to the fan holder and located between the two baffle walls and between the two fin assemblies.

16. The heat dissipation device as described in claim 15, wherein the top plate has a vaulted operating plate adapted for facilitating a user to grip the heat dissipation device.

17. The heat dissipation device as described in claim 15, wherein the fan has inlet and outlet facing the fin assemblies, respectively.

18. The heat dissipation device as described in claim 15, wherein the baffles are provided with holes therein.

19. The heat dissipation device as described in claim 15, wherein each of the fin assemblies is provided with a hole in communication with the cutout, and a screw is used to extend the top plate to engage in the hole in the each of the fin assemblies.

20. The heat dissipation device as described in claim 15 further comprising a heat pipe thermally connecting with the heat spreader and extending through the fin assemblies.

* * * * *